United States Patent [19]

Cestaro

[11] Patent Number: 4,599,557
[45] Date of Patent: Jul. 8, 1986

[54] LOGIC PROBE

[76] Inventor: Victor L. Cestaro, 19 Allegheny Dr. W., Farmingville, N.Y. 11738

[21] Appl. No.: 509,342

[22] Filed: Jun. 30, 1983

[51] Int. Cl.$^4$ ............................................. G01R 19/14
[52] U.S. Cl. .................................................... 324/133
[58] Field of Search ................. 324/133, 51, 72.5, 149

[56] References Cited

U.S. PATENT DOCUMENTS

| | | | |
|---|---|---|---|
| 3,525,939 | 8/1970 | Cartmell | 324/133 |
| 3,944,921 | 3/1976 | Tsuda et al. | 324/72.5 X |
| 4,110,687 | 8/1978 | Sneed, Jr. | 324/133 |
| 4,189,673 | 2/1980 | Shintaku | 324/133 |
| 4,321,543 | 3/1982 | Tuska | 324/133 X |

OTHER PUBLICATIONS

Hastings, Passive Logic Probe, Radio & Electronics Constructor, Jun. 1980, pp. 601-603.
Mercer, Logic Probe, Practical Electronics, Nov. 1980, p. 70.

Primary Examiner—Stanley T. Krawczewicz
Attorney, Agent, or Firm—Bauer & Amer

[57] ABSTRACT

A test probe for determining the logic state of a digital logic circuit, which probe utilizes threshold detectors to determine the relative voltage level of a test point, and gate circuits to enable various voltage conditions, e.g., a ground, high, low, uncommitted, or a supply voltage, or a random pulse or a pulse train, to be be monitored and the test result indicated on an LED alpha display device. The threshold detectors are selectively settable so that the probe is particularly adapted to test TTL and CMOS circuitry.

15 Claims, 4 Drawing Figures

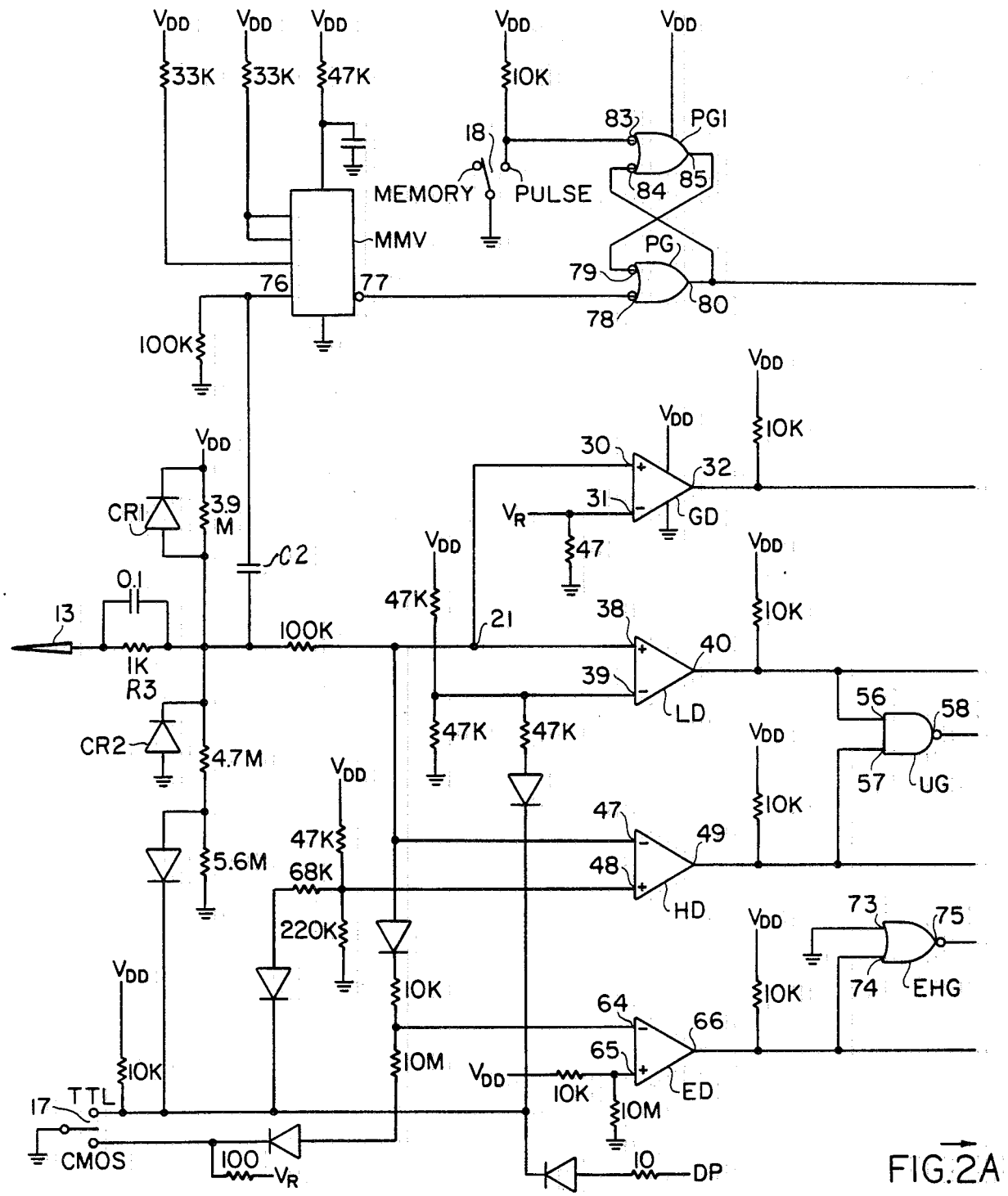
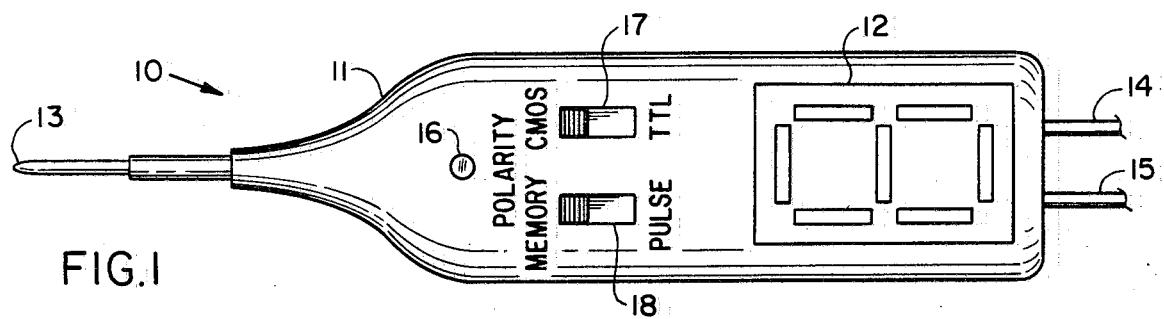
FIG. 2A
FIG. 1

LOGIC PROBE

FIELD OF THE INVENTION

The present invention relates to electronic test probes, and more particularly to electronic test probes for testing or checking digital logic circuits to ascertain the logic state or condition at the test point.

BACKGROUND OF THE INVENTION

Probes for testing digital logic circuits are known in the art, but, in general, they have been beset by certain shortcomings such that their use is not as convenient or as informative as it should be. For example, U.S. Pat. No. 3,628,141 discloses a probe having indicator lights which are selectively illuminated in various combinations which must be interpreted by the probe user to indicate various logic conditions of the tested circuit. Moreover, the brilliance of illumination of the indicator lights also enters into the user's interpretation of the lights to arrive at the ligical meaning of the indication. U.S. Pat. No. 3,750,015 discloses a probe employing a single indicator light which is illuminated to indicate a positive signal, i.e., a logic "1" condition, and extinguished to indicate the absence of a signal or a logic "0" condition. The patent further discloses a group of additional indicator lights that function as a binary counter to indicate the number of intermittent signals appearing at the test point within a given period of time. As an alternate arrangement, a seven segment light emitting diode (hereinafter LED) display is disclosed to indicate decimally the count of intermittent signals. U.S. Pat. No. 3,838,339 discloses a digital test probe that includes a series of indicator lights that are illuminated or not to indicate the logic condition of the circuit at the test point. The probe enables more circuit conditions to be detected and indicated than the probes of the above mentioned patents, but this requires more indicator lights to be interpreted by the person using the probe. U.S. Pat. No. 4,145,651 discloses a logic test probe employing two indicator lights which in combination indicate six circuit conditions. Thus, the probe user interprets an indicator light being on, off, or flashing to arrive at a determination of the tested circuit condition.

GENERAL DESCRIPTION OF THE INVENTION

The present invention is directed to a logic probe that is useful in testing logic circuits for all conditions which may be encountered when checking or troubleshooting a circuit. The probe displays the test result in an unambiguous way so that the probe user is not required to interpret the significance of one of a series of lights being illuminated. In general, the probe can test for the following logic conditions at a circuit test point: ground; logic "1" or high; logic "0" or low; unconnected or uncommitted, i.e., neither high nor low; supply voltage; and a pulse condition, either a train of pulses or a random pulse. These circuit conditions are indicated by a seven element LED display in which the letters "G", "H", "L", "U", "E", and "P" indicate the foregoing circuit conditions, respectively.

The object of the invention is to provide an improved probe for checking or troubleshooting logic circuits.

Another object of the invention is to provide a logic probe having a display that unambiguously indicates a circuit condition.

Still another object of the invention is to provide a logic probe having a circuit condition indicating display that does not require interpretation by the probe user.

Yet another object of the invention is to provide a logic probe having an alpha display for indicating circuit conditions.

Another object of the invention is to provide a logic probe that is adapted to operate at the correct voltage levels for different types of logic circuits such, for example, as transistor transistor logic (TTL) circuits and complementary metal oxide semiconductor (CMOS) circuits.

In carrying out the invention, there are provided threshold detectors for determining the voltage level at the test point of a circuit relative to threshold levels set for determining a ground voltage, a low voltage or logic "0" level, a high voltage or logic "1" level, and a supply voltage. The threshold levels of the detectors, other than the ground detector, vary when testing or checking TTL and CMOS circuitry so a user operated switch is provided for selecting between TTL and CMOS threshold values which are preset by the probe circuitry. The threshold detectors are connected to a gating circuit comprising a plurality of gates, at least one gate for each circuit condition to be sensed other than pulse sensing. The gate associated with a circuit condition sensed will produce an output signal that controls the alpha display to indicate the sensed condition. An important aspect of the invention is that when one gate produces an output signal in response to a circuit condition, all of the other gates are blocked so that they do not produce an output signal. When a pulse train or a random pulse is sensed, all of the gates are blocked.

It is particularly noted that the test or input signal to the probe is first fed to a plurality of threshold detectors, one of which will feed a signal to a gate which will control the display to indicate the condition of the test signal. The inclusion of threshold detectors enables the probe to be preset for exact TTL and CMOS voltage levels, taking into account allowable tolerances. Thus, the probe of the present invention does not subject a test signal directly to gating circuitry.

Other features and advantages of the invention may be gained from the foregoing and from the description of a preferred embodiment of the invention which follows.

DESCRIPTION OF THE DRAWING

FIG. 1 is an elevational view of a logic probe embodying the present invention;

FIGS. 2A and 2B are schematic wiring diagrams of the circuitry of the probe.

DETAILED DESCRIPTION OF THE INVENTION

Figure 2B:
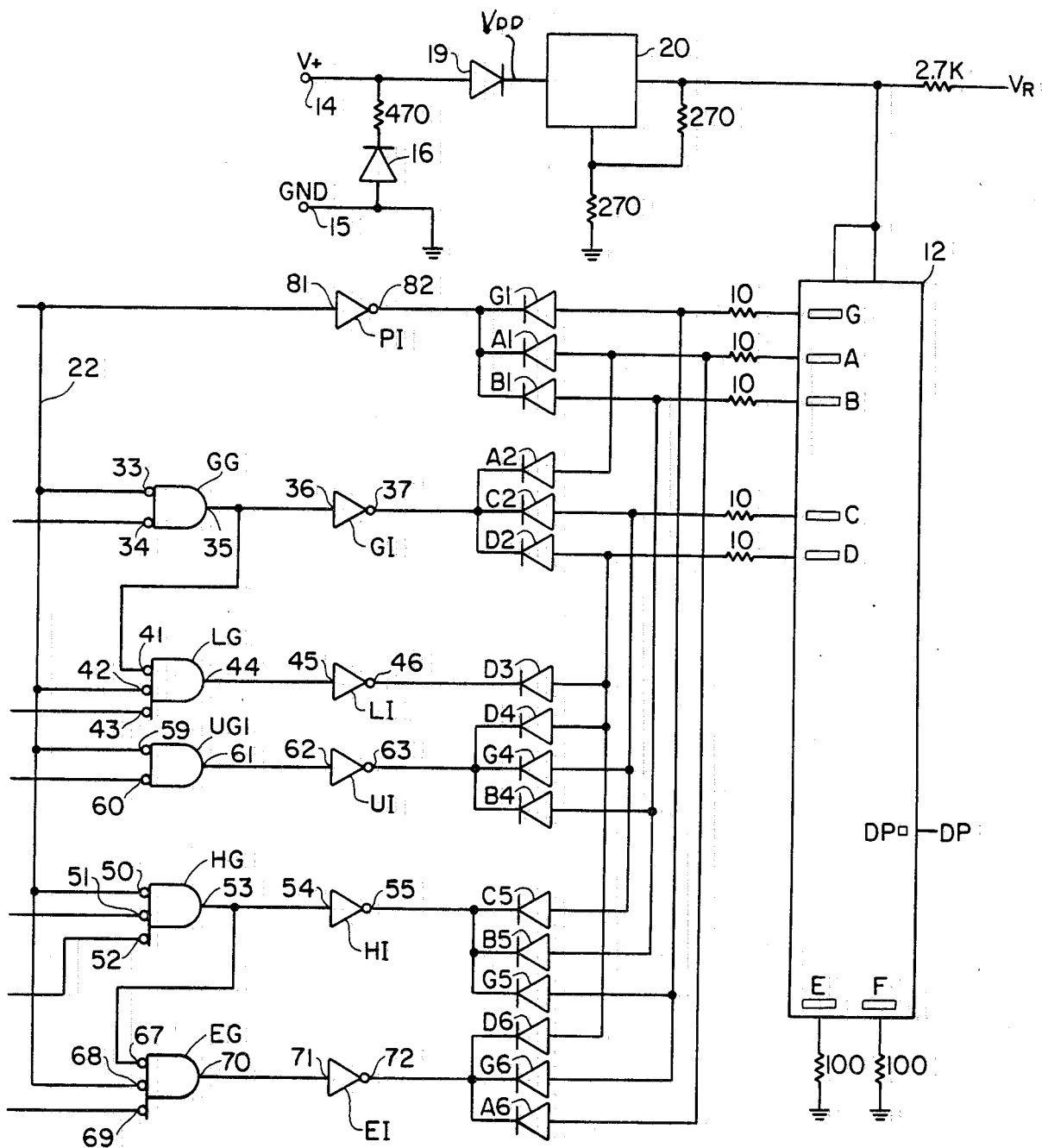

Referring to FIG. 1 of the drawing, the logic probe 10 comprises an enclosure 11 which houses the electrical circuitry hereinafter described, an LED alpha display device 12, and a conducting tip 13. A pair of conducting leads 14 and 15 having connectors by which the probe 10 can be connected or clipped to a power source are provided. That source will generally be provided by the circuitry to be checked by the probe. An LED 16 is provided to indicate if the leads 14 and 15 are connected with reverse polarity to the power source. If the leads are properly connected, LED 16 will not be illuminated. A toggle switch 17 is provided to set probe 10 for testing either TTL or CMOS circuitry. As will be seen hereinafter when the probe circuitry is described, switch 17 will determine the operative voltage level of the threshold detectors. A second toggle switch 18 is provided to enable probe 10 to indicate by means of its display 12 either a train of pulses or a single random pulse occurring at the circuit test point.

As has been mentioned, the logic probe of the present invention is intended for checking logic circuits to determine whether a particular circuit point is at a high voltage level or at a low voltage level, or at ground level, or at the supply voltage level, or if the circuit point is uncommitted or unconnected, i.e., neither at a high nor a low voltage level, or if a pulse train is present at the circuit point. In the description which follows, when writing of voltage levels, they will be indicated simply at high or low. Thus, when an input or an output terminal of a circuit component such as a gate or a detector or an inverter is said to be high, it is to be understood as meaning that the voltage level at that terminal is high, and when an input or output is low, it is to be understood as meaning that the voltage level at that terminal is low. Also, an input or an output terminal will simply be referred to as an input or an output. Thus, an input terminal of a gate will be described as the input of the gate and if the voltage level at an input terminal is high, it will be described as the input of the gate is high.

Since probe 10 is intended for use in testing both TTL and CMOS circuitry, the following standards should be mentioned. In TTL circuitry, the supply or operating voltage is from 4.5 to 5.5 volts, and, according to industry standards, a low voltage level is one that is less than or equal to 0.8 volts and a high voltage level is one that is equal to or greater than 2.4 volts. In CMOS circuitry, the supply or operating voltage is from 3.0 to 15.0 volts, with a low level voltage being 30% of the supply voltage and a high level voltage being 70% of the supply voltage.

Figure 3:
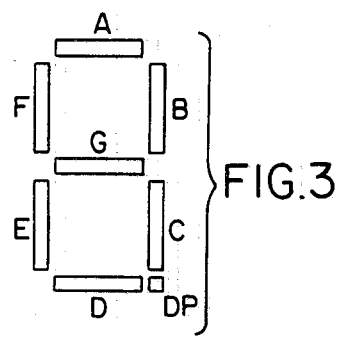
FIG. 3 is a schematic drawing of a seven segment LED alpha display device.

Attention is now directed to FIG. 2 of the drawing, and particularly to the power supply circuits shown in the upper right hand corner thereof. Assume that lead 14 of probe 10 is the positive lead. It should be connected to the V+ terminal of the circuitry being tested, and lead 15 should be connected to the ground terminal. Of course, before actually connecting leads 14 and 15 to the power supply, switch 17 should be moved to the TTL or the CMOS position depending on whether the circuitry being checked employs TTL or CMOS logic. In this way, proper voltage levels are applied to the probe circuitry. If the leads are connected opposite to the way they should be, i.e., lead 14 to ground and lead 15 to V+, reverse polarity LED 16 will conduct and become illuminated to indicate that the connection of the leads should be reversed. Diode 19 will be reverse biased in this condition and prevent the incorrect polarity voltage from being applied to the probe circuitry. Also, it should be noted that when switch 17 is moved to its TTL position, a circuit (lower left hand corner of FIG. 2) is completed to illuminate light emitting diode DP in alpha display device 12 which thus serves as a further indication that the probe is set to test TTL circuitry rather than CMOS circuitry. See FIG. 3 for the location of diode DP relative to the principal LED elements of the display device.

With leads 14 and 15 properly connected to the supply voltage and V+ being approximately 5 volts (TTL circuitry being assumed), the voltage drop across diode 19 will be about 0.6 volts so that the voltage at terminal $V_{DD}$ will be approximately 4.4 volts. Voltage regulator 20 provides a regulated output of about 2.5 volts for LED display 12. It also assures that the ground reference voltage $V_R$ remains constant. Of course, if CMOS circuitry is under test and leads 14 and 15 are connected to the supply voltage of the CMOS circuitry, the voltage at terminal $V_{DD}$ will be dependent on the supply voltage of the CMOS circuitry, which as noted hereinabove falls within the range of 3.0 to 15.0 volts.

Attention is now directed to conducting tip 13 and the protective circuits to which it is immediately connected to prevent voltage overloads from being applied to the remainder of the probe circuits. Tip 13 is connected through resistor R3 and clamping diode CR1 to $V_{DD}$. Thus, if tip 13 contacts a voltage source that exceeds the supply voltage $V_{DD}$, diode CR1 will conduct and, in effect, short out the rest of the probe circuitry. Diode CR2 performs the same function when tip 13 contacts a high negative voltage. In both instances, resistor R3 limits the current through the diodes.

Since probe 10 is intended to function and detect voltage levels in both TTL and CMOS logic circuits, threshold detectors GD, LD, HD, and ED are provided to determine when a voltage level is at ground level, a low level, a high level, or at supply voltage, respectively. Those levels for TTL and CMOS circuits were previously specified. Accordingly, one input to each of the threshold detectors is set to a voltage level depending on the type circuit, TTL or CMOS, being checked. Switch 17 (lower left hand corner of FIG. 2) is moved to either the TTL or the CMOS position. It is clear from the circuit diagram that the position of switch 17 determines the threshold voltage levels at detectors LD, HD, and ED. The threshold level for detector GD is established at ground reference level $V_R$. While the resistance values for the various voltage divider circuits could be determined by those skilled in the art based on the information hereinabove given, the circuit diagram indicates operative resistance values for the various resistors. It might be mentioned here that the probe itself employs CMOS circuitry and, therefore, operates over a relatively wide voltage range.

The threshold level of detector GD is set at 20 to 50 millivolts. The threshold level of detector LD is set at about 0.8 volts for TTL circuitry and about 30% of $V_{DD}$ for CMOS circuitry. The threshold level of detector HD is set at about 2.5 volts for TTL and about 70% of $V_{DD}$ for CMOS. The threshold level of detector ED is set at about 0.2 to 0.6 volts below the supply voltage. The "float" level at point 21 for the detector inputs is set at about 1.5 volts for TTL and at about 50% of $V_{DD}$ for CMOS.

Considering threshold detector GD, if probe tip 13 is put in contact with a circuit point that is at or below ground level, that voltage is applied to input 30 of detector GD, and since it does not exceed the threshold voltage on input 31, detector output 32 is low as is the input 34 of NAND gate GG. As will be shown hereinafter, input 33 to gate GG is also low so output 35 of gate GG is high. Input 36 of inverter GI is high so its output 37 is low. When output 37 goes low, it serves as a sink for current to flow through diodes A2, C2, and D2 which causes LED segments A, C, and D of display to be illuminated. LED segments E and F are illuminated under all circumstances and at all times that probe 10 is in use. Therefore, display 12 is illuminated to show the letter "G", thus indicating that the voltage level at probe tip 13 is at ground level. See FIG. 3.

If probe tip 13 is put in contact with a circuit point that is above ground level, that voltage is applied to input 30 of detector GD, but since it exceeds the threshold voltage level on input 31, the detector output 32 is high and input 34 of gate GG is high. Therefore, the output of gate GG and the input to inverter GI is low. Consequently, output 37 of inverter GI is high and there is no conductance through diodes A2, C2, and D2, and LED segments are not illuminated.

As indicated above, and until the contrary is stated, it will be assumed that line 22 and, consequently, inputs 33, 42, 59, 50, and 68 to NAND gates GG, LG, UG1, HG, and EG are low. This condition will persist if a pulse train or a single random pulse is not sensed or detected by probe tip 13.

If tip 13 senses a voltage level such that input 38 is below the threshold level at 39 set for low voltage level detector LD, the output 40 of detector LD goes low as does input 43 to gate LG. As mentioned above, input 42 to gate LG is low, as is input 41. The latter input is low because gate GG output 35 is low. The latter, i.e., output 35 of gate GG, is high only when threshold detector GD responds to a ground detection as described above. The voltage level presently being considered is low, but it is above ground so that output 35 of gate GG is low. Now, with all three inputs to gate LG being low, the gate output 44 and inverter LI input 45 are high. Therefore, inverter output 46 is low and serves as a sink for current to flow through diode D3, causing LED segment D to be illuminated. Thus, display 12 shows the letter "L" to indicate a low voltage level circuit condition, it being remembered that LED segments E and F are always lit.

It should be noted that when tip senses a ground level voltage, detector LD will respond thereto (as well as detector GD) as to a low level voltage, but output 35 of gate GG will be high, thus making input 41 of LG high and preventing LG output 44 going high.

Attention is now directed to the high voltage level sensing circuit comprising threshold detector HD, NAND gate HG, and inverter HI. Threshold detector HD is an inverting detector in which the threshold level at input 48 is set high. Therefore, when the voltage level sensed by tip 13 is below the threshold value and, therefore, low, input 47 of detector HD is low and the detector output 49 is high. Input 51 of gate HG is high and output 53 is low, thereby preventing inverter HI output 55 from serving as a sink for diodes C5, B5, and G5. Consequently LED segments C, B, and G are not illuminated. When the voltage level sensed by tip 13 exceeds the threshold level of HD, output 49 of HD is low. Thus, input 51 of gate HG is low. Inputs 50 and 52 will, for now, be assumed low so gate output 53 is high. Inverter HI output 55 will be low and diodes C5, B5, and G5 will conduct to cause LED segments C, B, and G to be illuminated, thus displaying the letter "H" to indicate that a high voltage level has been sensed.

If output 49 of threshold detector HD is high because the voltage level sensed by tip 13 is not high enough to be tested as a high voltage level, and output 40 of threshold detector LD is high because the voltage level sensed by tip 13 is not low enough to be considered a low voltage level, the two inputs 56 and 57 to NAND gate UG are high so the output 58 of gate UG is low. Therefore, input 60 of NAND gate UG1 is low (as is input 59) and output 61 is high. Inverter UI input 62 is high and output 63 is low. Thus, dioded D4, C4, and B4 will conduct to cause LED segments D, C, and B to become illuminated. With those LED segments, together with segments E and F, illuminated, the letter "U" is displayed to indicate that tip 13 is in contact with an uncommitted voltage, or a voltage floating between high and low levels.

It now is assumed that the voltage level at tip 13 is at the supply voltage. Tip 13 is connected to the inverting input 64 of detector ED so that when input 64 exceeds the threshold input 65 (as it does when tip 13 is at the supply voltage), output 66 goes low. When output 66 is low, input 69 of NAND gate EG is low. Input 68 is low, as previously mentioned, and input 67 is low because gate HG is not enabled and its output 53 is low. Gate HG is not enabled because both inputs 73 and 74 to NOR gate EHG are low and its output 75 is high as is input 52 to gate HG. It should be noted that if the voltage level at the probe tip is high enough for detector ED to have a low output, detector HD will also have a low output, but gate EHG prevents gate HG from being enabled. Since all inputs to gate EG are low, the gate output 70 is high as is input 71 to inverter EI. Output 72 of inverter EI is low, thereby allowing diodes D6, G6, and A6 to conduct and LED segments D, G, and A to become illuminated. Thus, the letter "E" is displayed to indicate that tip 13 is in contact with a circuit element that is at the supply voltage.

Attention is now directed to the upper left hand corner of FIG. 2 where the circuits that respond to a pulse train are located. First, it will be assumed that toggle switch 18 is in the PULSE position, i.e., closed. Except for one circuit condition to be described hereinafter, switch 18 will normally be in the closed position. With switch 18 closed, input 83 of NOR gate PG1 will be low and gate output 85 will be high, and as a result input 79 of NOR gate PG will be high. Input 78 of gate PG will be high because output 77 of monostable multivibrator MMV is high, the quiescent state of MMV. Therefore, since both inputs 79 and 78 of gate PG are high, output 80 is low. This has no effect on gate PG1 since input 83 thereof is already low. Now, if tip 13 is put in contact with a circuit point at which a train of pulses appear, those pulses will be transmitted, through capacitor C2, to input 76 of multivibrator MMV. When the pulse appears at input 76, output 77 goes low. The cycle rate for multivibrator MMV is determined by the time constant of RC circuit comprising resistor R20 and capacitor C1. If succeeding pulses at input 76 recur within the time period established by R20 and C1, multivibrator MMV does not reset to its stable state and the result is that output 77 remains low. When output 77 is low, input 78 to gate PG is low and gate output 80 is high. With output 80 of gate PG high, the input 84 to gate PG1 will be high, but input 83 will be low since switch 18 is closed. Therefore, output 85 will be high and input 79 of gate PG will be high. But, the pulse sensing circuit will function as described above because input 78 of gate PG will remain low since output 77 of multivibrator MMV is kept low by the train of pulses on MMV input 76. With output 80 of gate PG high, input 81 of inverter PI is also high and its output 82 is low. The low level of output 82 serves as a current sink for diodes G1, A1, and B1. Therefore, LED segments G, A, and B are illuminated (segments E and F are illuminated as previously mentioned) so that the letter "P" is displayed to indicate that probe tip 13 is sensing a train of pulses.

When the output 80 of gate PG is high, as when a pulse train is sensed as just described, the high voltage is applied to inputs 33, 42, 59, 50, and 68 of gates GG, LG, UG1, HG, and EG, thereby effectively blocking or preventing those gates from producing a high voltage at their outputs. Thus, none of the diodes A2 to A6 will be enabled to conduct current.

In addition to being able to sense trains of pulses, it is desirable that probe 10 be capable of sensing and indicating a random or transient pulse since logic circuits must often be checked for the occurrence of such pulses. The circuitry already described is capable of performing this function simply by opening switch 18. This is accomplished by moving toggle switch 18 to the MEMORY position. When this is done, tip 13 can be placed in contact with the circuit to be monitored, and left there. If a pulse occurs at that point, at any time that tip 13 is in contact therewith, the probe will sense the pulse, and display 12 will be illuminated with the letter "P", thus indicating that at least one pulse was sensed.

A transient pulse is sensed as follows. With switch 18 open, input 83 of gate PG1 will be high. Output 85 of gate PG1 is high because input 84 is low. Since output 85 is high, input 79 to gate PG is high. Input 78 to gate PG is high because output 77 of multivibrator MMV is high, there being no pulse transmitted to the multivibrator input 76. Thus, inputs 78 and 79 of gate PG are high and the gate output 80 is low. The low output at 80 means that the input 84 of gate PG1 is low, as previously mentioned. Consequently, the circuit comprising multivibrator MMV and gates PG and PG1 are stable in the states described. Display 12 does not give any indication of a circuit condition; it is quiescent.

When a solitary pulse is sensed by tip 13, that pulse will trigger multivibrator MMV so that output 77 goes low as does input 78 of gate PG. Gate output 80, therefore, goes high to make input 84 of gate PG1 go high. With both inputs 83 and 84 high, PG1 output 85 goes low to make input 79 of gate PG low, thus keeping output 80 of gate PG high. It does not matter that the pulse input to multivibrator MMV disappears and the multivibrator resets to its stable state with its output 77 (and input 78 to gate PG) high, since input 79 is locked in at a low level, thus keeping PG gate output 80 high. With output 80 high, pulse inverter PI functions to cause diodes G1, A1, and B1 to conduct and illuminate LED segments G, A, and B. The letter "P" therefore is displayed to indicate that a pulse was sensed by tip 13. And that display will remain until such time as switch 18 is moved to the PULSE position, i.e., opened, or the probe leads 14 and 15 disconnected from the power source. The circuit arrangement just described is particularly advantageous when a circuit is being checked for the occurrence of random pulses which may appear at relatively long intervals. The probe can be connected to the circuit being checked and then left unattended. If a pulse occurs, the probe will sense it and, in effect, record its occurrence which can be noted when the display is viewed at a later time.

Having thus described the invention, it is to be understood that other embodiments thereof, differing from the preferred embodiment described, could be provided without departing from the spirit and scope of the invention. Therefore, it is intended that the foregoing specification and the accompanying drawing be interpreted as illustrative rather than in a limiting sense.

What is claimed is:

1. Test equipment for determining the logic state of a digital circuit comprising: electrically conductive probe means for contacting a circuit to determine the voltage or logic state of the circuit; logic "1" detector means having a probe input connected to said probe means, a threshold input, and an output for producing a signal when the voltage at said probe input exceeds the voltage at said threshold input; first gate means responsive to an output signal from said logic "1" detector means for producing a logic "1" signal; logic "0" detector means having a probe input connected to said probe means, a threshold input, and an output for producing a signal when the voltage at said probe input falls below the voltage at said threshold input; second gate means responsive to an output signal from said logic "0" detector means for producing a logic "0" signal; means for setting voltage levels at the probe and threshold inputs of said detector means for testing TTL circuitry and for setting different voltage levels at said inputs for testing CMOS circuitry; means for selecting which voltage levels are set at said inputs of said detector means; and display means connected to said first and second gate means and responsive to a logic signal therefrom for indicating the logic state of the circuit under test.

2. Test equipment according to claim 1 including: ground detector means having a threshold input, means for setting the voltage level at said threshold input to accord with ground voltage for a circuit, a probe input connected to said probe means so that the voltage level of a circuit being tested can be compared to the threshold voltage level, an output for producing a signal when the voltage at said probe input falls below the threshold voltage at said threshold input; means connecting said probe input to the probe input of said logic "0" detector means whereby the voltage at the probe input to said ground detector means is set depending on whether TTL or CMOS circuitry is being tested; third gate means responsive to an output signal from said ground detector means for producing a ground level signal, said third gate means being connected to said display means whereby a ground level signal is indicated; and means connecting said third gate means to said second gate means so that said second gate means produces a logic "0" signal only when said third gate means does not produce a ground level signal.

3. Test equipment according to claim 2 including: means connecting the output of said third gate means to an input of said second gate means so that said second gate means produces a logic level signal only when said third detector means detects a voltage level above ground voltage and said third gate means does not produce a ground level signal.

4. Test equipment according to claim 1 including: additional gate means for producing an output signal which causes said display means to indicate an uncommitted circuit condition when said logic "1" and said logic "0" detector means do not produce output signals.

5. Test equipment according to claim 2 including supply voltage detector means having a threshold input, means for setting the voltage level at said threshold input to accord with the supply voltage for a circuit being tested, a probe input connected to said probe means so that the voltage level of the circuit being tested can be compared to the threshold voltage level, an output for producing a signal when the voltage at said probe input exceeds the threshold voltage; means connecting said probe input to the probe input of said logic "1" detector means whereby the voltage at the probe input to said supply voltage detector means is set depending on whether TTL or CMOS circuitry is being tested; fourth gate means responsive to an output signal from said supply voltage detector means for producing a supply voltage level signal, said fourth gate means being connected to said display means whereby a supply voltage level signal is indicated; and means connecting said first gate means to said fourth gate means so that said fourth gate means produces a supply voltage level signal only when said first gate means does not produce a logic "1" signal.

6. Test equipment according to claim 5 including: fifth gate means having an input connected to the output of said supply voltage detector means and an output connected to said first gate means so that said first gate means produces a logic "1" signal only when said fourth detector means does not produce a signal to cause said fourth gate means to produce a supply level signal.

7. Test equipment for determining the logic state of a digital circuit comprising: electrically conductive probe means for contacting a circuit to determine the voltage or logic state of the circuit; display means for indicating that said probe means is contacting a ground level voltage or a logic "0" test point; first gate circuit means having a ground level threshold input, a probe input connected to said probe means, and an output for producing a signal when said probe means contacts a ground level test point, and a first AND gate connected to said output for producing a display signal to cause said display means to indicate a ground level voltage; second gate circuit means having a logic "0" threshold input, a probe input connected to said probe means, an output for producing a signal when said probe means contacts a logic "0" test point, and a second AND gate connected to said output for producing a display signal to cause said display means to indicate a logic "0" voltage; and means connecting said first and said second AND gates so that a display signal from said first AND gate prevents said second AND gate from producing a display signal.

8. Test equipment according to claim 7 including circuit means to set the threshold input of said first gate circuit means for a logic "0" voltage level for TTL logic circuitry; additional circuit means to set said threshold input of said first gate circuit means for a different logic "0" voltage level for CMOS logic circuitry; and switch means for selecting either said circuit means or said additional circuit means to set the logic "0" voltage level of said first gate circuit means.

9. Test equipment for determining the logic state of a digital circuit comprising: electrically conductive probe means for contacting a circuit to determine the voltage or logic state of the circuit; display means for indicating that said probe means is contacting a supply voltage or a logic "1" test point; first gate circuit means having a supply level threshold input, a probe input connected to said probe means, an output for producing a signal when said probe means contacts a supply voltage level test point, and a first AND gate connected to said output for producing a display signal to cause said display means to indicate a supply voltage level; second gate circuit means having a logic "1" threshold input, a probe input connected to said probe means, an output for producing a signal when said probe means contacts a logic "1" test point, and a second gate means for producing a display signal to cause said display means to indicate a logic "1" voltage; and additional gate means connected to said first gate circuit means output and to said second gate means to prevent said second gate means producing a display signal when both said first gate circuit means and said second gate circuit means produce output signals.

10. Test equipment according to claim 9 including: circuit means to set the threshold input of said second gate circuit means for a logic "1" voltage level for TTL logic circuitry; additional circuit means to set said threshold input of said second gate circuit means for a different logic "1" voltage level for CMOS logic circuitry; and means for selecting either said circuit means or said additional circuit means to set the logic "1" voltage level of said second gate circuit means.

11. Test equipment for determining the logic state of a digital circuit comprising: electrically conductive probe means for contacting the point of a circuit to be tested; display means for indicating the logic state of the circuit test point and the occurrence of a train of pulses or a random pulse at the test point; monostable multivibrator means having an input connected to said probe means, and an output which remains in its astable state for a predetermined period of time after a test point voltage is applied to the input; circuit means connected to the output of said multivibrator means and to said display means, said circuit means including a first OR gate having a first input connected to the output of said multivibrator means, a second input, and an output connected to said display means; a second OR gate having a first input connected to the output of said first OR gate, an output connected to said second input of said first OR gate, and a second input; and switch means for selectively causing said second input of said second OR gate to be at a high voltage or at ground level, the arrangement being such that when said switch means causes said second input of said second OR gate to be at ground level a train of pulses at said probe means will cause the output of said first OR gate to trigger said display means to indicate said train of pulses and when said switch means causes said second input of said second OR gate to be at a high level a random pulse will cause the output of said first OR gate to trigger and lock said display means to record the passage of the random pulse.

12. Test equipment according to claim 11 including: first AND gate means connected to said probe means and to said display means, said first AND gate means being enabled when said probe means contacts a logic "0" circuit test point to cause said display means to indicate a logic "0" voltage level; second AND gate means connected to said probe means and to said display means, said second AND gate means being enabled when said probe means contacts a logic "1" circuit test point to cause said display means to indicate a logic "1" voltage level; and means connecting the output of said first OR gate to said first and second AND gate means to disable said gate means when said first OR gate causes said display means to indicate a train of pulses or a random pulse.

13. Test equipment for determining the state of a digital circuit comprising: electrically conductive probe means for contacting a circuit to be tested; display means for indicating a logic "0" voltage level, a logic "1" voltage level, and a pulse condition; first gate means coupled to said probe means and to said display means, said gate means being operative to cause said display means to indicate a logic "0" voltage level when said probe means contacts a circuit at the logic "0" voltage level; second gate means coupled to said probe means and to said display means, said second gate means being operative to cause said display means to indicate a logic "1" voltage level when said probe means contacts a circuit at the logic "1" voltage level; and circuit means coupled to said probe means and to said display means, said circuit means being operative to cause said display means to indicate a pulse train or a random pulse when said probe means contacts a circuit at which a pulse train or a random pulse appears, said circuit means also being connected to said first and said second gate means so as to disable said gate means when said circuit means is operative.

14. Test equipment according to claim 13 wherein said display means is a seven segment LED display that indicates the logic state of a circuit by an alpha representation.

15. Test equipment according to claim 14 wherein the logic "0" state is represented by the letter "L", the logic "1" state is represented by the letter "H", and a pulse train or a random pulse is represented by the letter "P".

* * * * *